(12) United States Patent
Okada et al.

(10) Patent No.: US 11,555,044 B2
(45) Date of Patent: Jan. 17, 2023

(54) THIN-FILM FORMING RAW MATERIAL FOR USE IN ATOMIC LAYER DEPOSITION METHOD, THIN-FILM FORMING RAW MATERIAL, METHOD FOR PRODUCING THIN-FILM, AND COMPOUND

(71) Applicant: ADEKA CORPORATION, Tokyo (JP)

(72) Inventors: Nana Okada, Tokyo (JP); Tomoharu Yoshino, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 17/281,105

(22) PCT Filed: Sep. 24, 2019

(86) PCT No.: PCT/JP2019/037274
§ 371 (c)(1),
(2) Date: Mar. 29, 2021

(87) PCT Pub. No.: WO2020/071175
PCT Pub. Date: Apr. 9, 2020

(65) Prior Publication Data
US 2021/0340162 A1 Nov. 4, 2021

(30) Foreign Application Priority Data
Oct. 4, 2018 (JP) .............................. JP2018-189092

(51) Int. Cl.
*C23C 16/455* (2006.01)
*C23C 16/18* (2006.01)
*C07F 5/00* (2006.01)

(52) U.S. Cl.
CPC ................ *C07F 5/00* (2013.01); *C23C 16/18* (2013.01); *C23C 16/45553* (2013.01)

(58) Field of Classification Search
CPC ... C23C 16/18; C23C 16/20; C23C 16/45525; C23C 16/45553
See application file for complete search history.

(56) References Cited

U.S. PATENT DOCUMENTS

| 5,149,853 A * | 9/1992 | Erdmann | .................. C07F 5/00 546/4 |
| 5,209,952 A * | 5/1993 | Erdmann | .................. C07F 5/00 556/70 |

FOREIGN PATENT DOCUMENTS

| JP | 62-276832 | 12/1987 |
| JP | 2017-503079 | 1/2017 |

(Continued)

OTHER PUBLICATIONS

Machine translation KR20160082350 (Year: 2016).*

(Continued)

*Primary Examiner* — Elizabeth A Burkhart
(74) *Attorney, Agent, or Firm* — Wenderoth, Lind & Ponack, L.L.P.

(57) ABSTRACT

The present invention provides a thin-film forming raw material, which is used in an atomic layer deposition method, including a compound represented by the following general formula (1):

(1)

(Continued)

where $R^1$ to $R^4$ each independently represent an alkyl group having 1 to 5 carbon atoms, and $A^1$ represents an alkanediyl group having 1 to 5 carbon atoms.

1 Claim, 4 Drawing Sheets

(56) References Cited

FOREIGN PATENT DOCUMENTS

| | | |
|---|---|---|
| JP | 2018-10936 | 1/2018 |
| JP | 2018-11067 | 1/2018 |
| JP | 2018-524808 | 8/2018 |
| KR | 10-2016-0082350 | 7/2016 |

OTHER PUBLICATIONS

Machine translation JP62-276832 (Year: 1987).*
International Search Report dated Dec. 3, 2019 in International (PCT) Application No. PCT/JP2019/037274.
Extended European Search Report dated May 17, 2022, in corresponding European Patent Application No. 19869747.6.
Herbert Schumann et al., "Novel Intramolecularly Stabilized Organogallium and Organoindium Compounds and Their Use in Movpe", Polyhedron, vol. 9, No. 2/3, 1990, pp. 353-360.

* cited by examiner

THIN-FILM FORMING RAW MATERIAL FOR USE IN ATOMIC LAYER DEPOSITION METHOD, THIN-FILM FORMING RAW MATERIAL, METHOD FOR PRODUCING THIN-FILM, AND COMPOUND

TECHNICAL FIELD

The present invention relates to a thin-film forming raw material for use an atomic layer deposition method, which contains a gallium compound having a particular structure, a thin-film forming raw material, which contains a gallium compound having a particular structure, a method of producing a thin-film including forming a thin-film containing a gallium atom through use of the above-mentioned raw materials, and a novel gallium compound having a particular structure.

BACKGROUND ART

Thin-film forming materials each containing a tin element exhibit specific electric characteristics and have been applied to various uses. For example, those thin-film forming materials have been used as thin-films for electronic devices such as semiconductors, films for optoelectronic applications such as solar cells or LEDs, and the like.

As a method of producing a thin-film, there are given, for example, a sputtering method, an ion plating method, an MOD method, such as a coating thermal decomposition method and a sol-gel method, and a CVD method. Of those, an atomic layer deposition method (sometimes called an ALD method) is an optimum production process because the atomic layer deposition method has a number of advantages, such as excellent composition controllability and step coverage, suitability for mass production, and capability of hybrid integration.

Various materials that can be used in vapor phase thin-film formation methods, such as the CVD method and the ALD method, have been reported. However, a thin-film forming raw material applicable to the ALD method is required to have a temperature region called an ALD window, and the temperature region is required to be sufficiently wide. Accordingly, it is common general technical knowledge in the art that even a thin-film forming raw material, which can be used in the CVD method, may not be suitable for the ALD method in many cases.

As a gallium compound to be used as a raw material for the ALD method, in Patent Documents 1 to 4, there are disclosed trialkylgalliums, such as trimethylgallium and triethylgallium, and tris(dialkylamino)galliums, such as tris(dimethylamino)gallium and tris(diethylamino)gallium.

CITATION LIST

Patent Document

Patent Document 1: JP 2018-524808 A (claim 7)
Patent Document 2: JP 2018-011067 A (paragraph [0174])
Patent Document 3: JP 2017-503079 A (paragraph [0067])
Patent Document 4: JP 2018-010936 A (paragraph [0027])

SUMMARY OF INVENTION

Technical Problem

The thin-film forming raw material, which is used in an atomic layer deposition method, is required to be excellent in thermal stability, and to react with a reactive gas at a low temperature so that a high-quality thin-film can be produced with high productivity. In particular, there has been a strong demand for a thin-film forming raw material, which is used in an atomic layer deposition method, enabling a high-quality thin-film to be obtained.

In order to obtain a high-quality gallium atom-containing thin-film through use of trialkylgallium, such as trimethylgallium or triethylgallium disclosed in Patent Documents 1 to 4, as a thin-film forming raw material, which is used in an atomic layer deposition method, a method using an ozone gas as a reactive gas has hitherto been used. This is because the reactivity between the trialkylgallium and the ozone gas is high, but there has been a problem in that the ozone gas may cause significant damage also to peripheral members. In order to address this problem, it is conceivable to use a reactive gas, such as water vapor, which has low reactivity and less influences the peripheral members. However, when the trialkylgallium is used as the thin-film forming raw material, which is used in an atomic layer deposition method, and the water vapor is used as the reactive gas, there has been a problem in that a large amount of a residual carbon component is mixed in a thin-film to be obtained, and a high-quality gallium atom-containing film cannot be obtained. As another method, there has also been proposed a method of producing a thin-film through use of oxygen as the reactive gas and further through action of plasma. However, also in this case, it has been reported that a large amount of a residual carbon component is mixed in a thin-film to be obtained.

In addition, tris(dialkylamino)gallium, such as tris(dimethylamino)gallium or tris(diethylamino)gallium, forms a dimer to have a high melting point, and to become solid at normal temperature, and hence is not preferred as a thin-film forming raw material.

Accordingly, a first object of the present invention is to provide a thin-film forming raw material, which is used in an atomic layer deposition method, enabling a high-quality gallium atom-containing film to be obtained by an ALD method even when a reactive gas, such as water vapor, is used, and a method of producing a thin-film through use of the raw material.

In addition, the properties required in a compound (precursor) suitable as a raw material for forming a thin-film by vaporizing a compound by a CVD method or the like are that the compound has a low melting point, can be transported in a liquid state, has a low viscosity in the state of a liquid, has a high vapor pressure so as to be easily vaporized, and has high thermal stability. In particular, in a thin-film forming raw material that serves as a gallium atom supply source, there has been a demand for a thin-film forming raw material which has a low melting point and is excellent in transportability.

Accordingly, a second object of the present invention is to provide a thin-film forming raw material containing a gallium compound having a particular structure, which has a low melting point and is excellent in transportability.

Solution to Problem

The inventors of the present invention have made extensive investigations, and as a result, have found that the thin-film forming raw material containing a gallium compound having a particular structure can solve the above-mentioned problems, to thereby complete the present invention.

That is, according to one embodiment of the present invention, there is provided a thin-film forming raw material, which is used in an atomic layer deposition method, including a gallium compound represented by the following general formula (1):

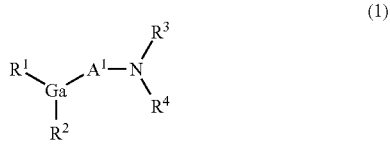

where $R^1$ to $R^4$ each independently represent an alkyl group having 1 to 5 carbon atoms, and $A^1$ represents an alkanediyl group having 1 to 5 carbon atoms.

In addition, according to one embodiment of the present invention, there is provided a thin-film forming raw material, including a gallium compound represented by the following general formula (2):

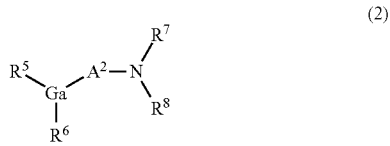

where $R^5$ to $R^8$ each independently represent an alkyl group having 1 to 5 carbon atoms, and $A^2$ represents an alkanediyl group having 1 to 5 carbon atoms, provided that a sum of the carbon atoms of $R^5$ to $R^8$ is 5 or more.

Further, according to one embodiment of the present invention, there is provided a method of producing a thin-film containing a gallium atom on a surface of a substrate, the method including the step of introducing, into a treatment atmosphere, vapor containing the compound obtained by vaporizing the thin-film forming raw material, which is used in an atomic layer deposition method, or the thin-film forming raw material and subjecting the compound to decomposition and/or a chemical reaction, to thereby deposit the compound on the surface of the substrate.

In addition, according to one embodiment of the present invention, there is provided a gallium compound represented by the following general formula (3):

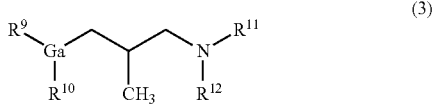

where $R^9$ to $R^{12}$ each independently represent an alkyl group having 1 to 5 carbon atoms.

Advantageous Effects of Invention

Through use of the thin-film forming raw material, which is used in an atomic layer deposition method, of the present invention, even when a reactive gas, such as water vapor, is used, a high-quality gallium atom-containing thin-film containing less residual carbon can be produced. In addition, through use of the thin-film forming raw material of the present invention, a thin-film can be produced with high productivity due to the excellent transportability of the thin-film forming raw material.

DESCRIPTION OF EMBODIMENTS

Figure 1:
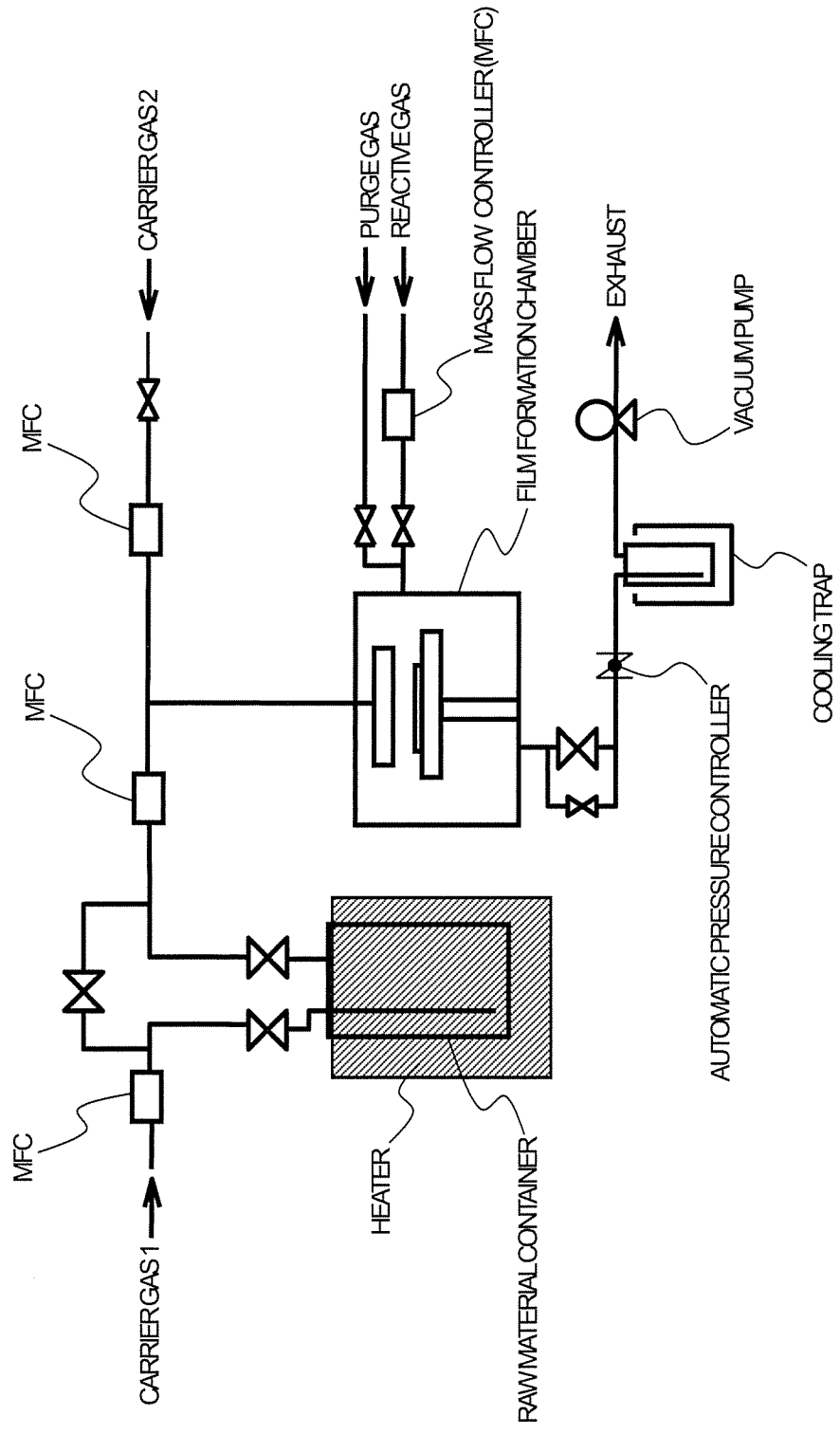
FIG. 1 is a schematic diagram for illustrating an example of an apparatus for chemical vapor deposition to be used in a method of producing a thin-film according to the present invention.

A thin-film forming raw material, which is used in an atomic layer deposition method, of the present invention contains a compound represented by the general formula (1).

In the general formula (1), $R^1$ to $R^4$ each independently represent an alkyl group having 1 to 5 carbon atoms.

In the general formula (1), examples of the alkyl group having 1 to 5 carbon atoms represented by $R^1$ to $R^4$ include methyl, ethyl, n-propyl, isopropyl, n-butyl, sec-butyl, tert-butyl, isobutyl, n-pentyl, sec-pentyl, tert-pentyl, isopentyl, and neopentyl.

In the general formula (1), $A^1$ represents an alkanediyl group having 1 to 5 carbon atoms.

In the general formula (1), examples of the alkanediyl group having 1 to 5 carbon atoms represented by $A^1$ include methylene, ethylene, propylene, methylethylene, butylene, 1-methylpropylene, 2-methylpropylene, 1,2-dimethylpropylene, 1,3-dimethylpropylene, 1-methylbutylene, 2-methylbutylene, 3-methylbutylene, and 4-methylbutylene.

In the general formula (1), it is preferred that $R^1$ to $R^4$ and $A^1$ be combined so that the compound has a liquid state at normal temperature and normal pressure and has a high vapor pressure. Specifically, the compound in which $R^1$ to $R^4$ each independently represent methyl or ethyl is preferred because the vapor pressure is high. Of those, the compound in which $R^1=R^2$ is particularly preferred. In addition, the compound in which $A^1$ represents ethylene, propylene, methylethylene, butylene, 1-methylpropylene, or 2-methylpropylene is preferred because the reactivity with water vapor is satisfactory. Of those, the compound in which $A^1$ represents propylene, 1-methylpropylene, or 2-methylpropylene is preferred because the ALD window is wide, and the compound in which $A^1$ represents 2-methylpropylene is particularly preferred. The compound in which $R^1$ to $R^4$ each independently represent methyl or ethyl and $A^1$ represents 2-methylpropylene is particularly preferred because the melting point is low.

As preferred specific examples of the compound represented by the general formula (1) to be used in the thin-film forming raw material, which is used in an atomic layer deposition method, of the present invention, there are given, for example, the following compounds No. 1 to No. 30.

In the following chemical formulae, "Me" represents a methyl group, and "Et" represents an ethyl group.

Compound No.1
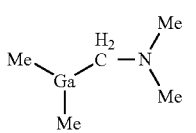
Compound No.2
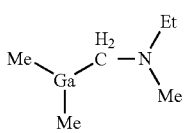
Compound No.3
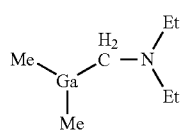
Compound No.4
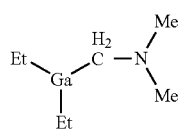
Compound No.5
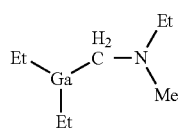
Compound No.6
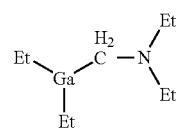
Compound No.7
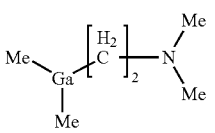
Compound No.8
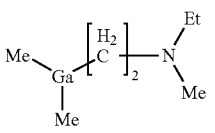
Compound No.9
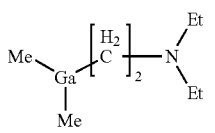
Compound No.10
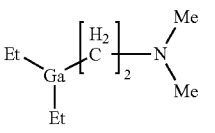
Compound No.11
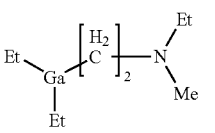
Compound No.12
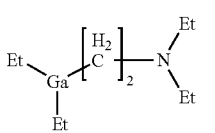
-continued
Compound No.13
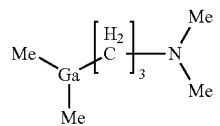
Compound No.14
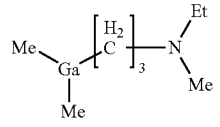
Compound No.15
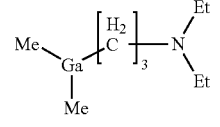
Compound No.16
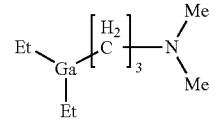
Compound No.17
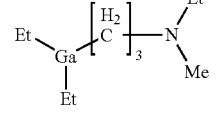
Compound No.18
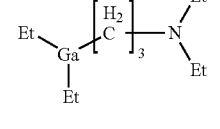
Compound No.19
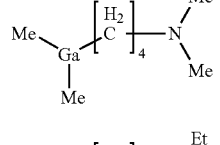
Compound No.20
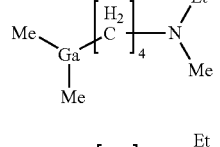
Compound No.21
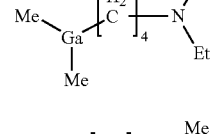
Compound No.22
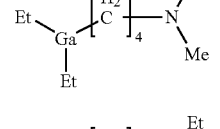
Compound No.23
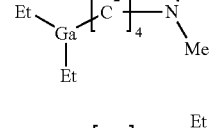
Compound No.24

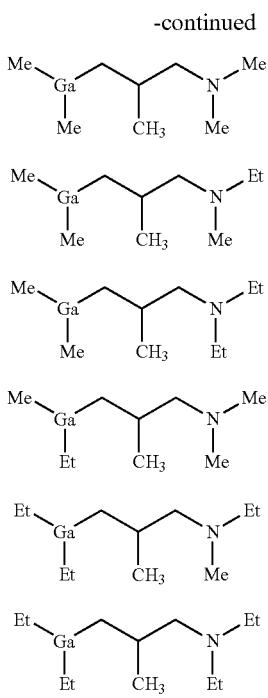

Compound No.25
Compound No.26
Compound No.27
Compound No.28
Compound No.29
Compound No.30

The compound represented by the general formula (1) to be used in the thin-film forming raw material, which is used in an atomic layer deposition method, of the present invention is not particularly limited by the production method therefor, and may be produced by a well-known synthesis method. For example, the compound may be obtained by subjecting gallium chloride and a halogenated dialkylamine to a Grignard reaction and causing the resultant to react with an alkyllithium.

It is only required that the thin-film forming raw material, which is used in an atomic layer deposition method, of the present invention contain the compound represented by the general formula (1), and the composition thereof varies depending on the kind of an intended thin-film. For example, when a thin-film containing only gallium as a metal is produced, the thin-film forming raw material, which is used in an atomic layer deposition method, of the present invention is free of a metal compound other than the gallium compound represented by the general formula (1) and a semimetal compound. Meanwhile, when a thin-film containing gallium and a metal other than gallium and/or a semimetal is produced, the thin-film forming raw material, which is used in an atomic layer deposition method, of the present invention may also contain a compound containing a metal other than gallium and/or a compound containing a semimetal (hereinafter sometimes referred to as "other precursor") in addition to the compound represented by the general formula (1). The thin-film forming raw material, which is used in an atomic layer deposition method, of the present invention may further contain an organic solvent and/or a nucleophilic reagent as described later.

The form of the thin-film forming raw material, which is used in an atomic layer deposition method, of the present invention is appropriately selected by a procedure, such as a transportation and supply method of the atomic layer deposition method to be used.

As the above-mentioned transportation and supply method, there are given a gas transportation method and a liquid transportation method. The gas transportation method involves heating and/or decompressing the thin-film forming raw material, which is used in an atomic layer deposition method, of the present invention in a container in which the raw material is stored (hereinafter sometimes simply referred to as "raw material container"), to thereby vaporize the raw material to obtain vapor, and introducing the vapor into a film formation chamber (hereinafter sometimes referred to as "deposition reaction portion") having a substrate set therein together with a carrier gas, such as argon, nitrogen, or helium, to be used as required. The liquid transportation method involves transporting the thin-film forming raw material, which is used in an atomic layer deposition method, of the present invention to a vaporization chamber under a state of a liquid or a solution, heating and/or decompressing the raw material in the vaporization chamber, to thereby vaporize the raw material to obtain vapor, and introducing the vapor into the film formation chamber. In the case of the gas transportation method, the compound represented by the general formula (1) itself may be used as the thin-film forming raw material, which is used in an atomic layer deposition method. In the case of the liquid transportation method, the compound represented by the general formula (1) itself or a solution obtained by dissolving the compound in an organic solvent may be used as the thin-film forming raw material, which is used in an atomic layer deposition method. Those thin-film forming raw materials, which are used in an atomic layer deposition method, may further contain the other precursor, a nucleophilic reagent, and the like.

In addition, in a multi-component ALD method, there are given a method involving vaporizing and supplying the thin-film forming raw material, which is used in an atomic layer deposition method, independently for each component (hereinafter sometimes referred to as "single source method"), and a method involving vaporizing and supplying a mixed raw material obtained by mixing a multi-component raw material with a desired composition in advance (hereinafter sometimes referred to as "cocktail source method"). In the case of the cocktail source method, a mixture of the compound represented by the general formula (1) and the other precursor or a mixed solution obtained by dissolving the mixture in an organic solvent may be used as the thin-film forming raw material, which is used in an atomic layer deposition method. The mixture or the mixed solution may further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, the relationship among the use temperature, the boiling point, and the flash point, and the like.

In addition, in the case of the multi-component ALD method, there is no particular limitation on the other precursor to be used together with the compound represented by the general formula (1), and a well-known general precursor used in the thin-film forming raw material, which is used in an atomic layer deposition method, may be used.

Examples of the other precursor include compounds of one kind or two or more kinds selected from the group consisting of compounds used as organic ligands, such as an alcohol compound, a glycol compound, a β-diketone compound, a cyclopentadiene compound, and an organic amine compound, and silicon or a metal. In addition, examples of the kind of the metal in the precursor include lithium, sodium, potassium, magnesium, calcium, strontium, barium, titanium, zirconium, hafnium, vanadium, niobium, tantalum, chromium, molybdenum, tungsten, manganese, iron, ruthenium, cobalt, rhodium, iridium, nickel, palladium, platinum, copper, silver, gold, zinc, aluminum, indium, germanium, tin, lead, antimony, bismuth, scandium, ruthenium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

In addition, examples of the β-diketone compound include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-2,4-dione, and 2,2,6,6-tetramethyl-1-(2-methoxyethoxy)heptane-3,5-dione.

In addition, examples of the cyclopentadiene compound include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene, and examples of the organic amine compound to be used as the organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

In the case of the single source method, the above-mentioned other precursor is preferably a compound which is similar to the compound represented by the general formula (1) in the behavior of thermal decomposition and/or oxidative decomposition. In the case of the cocktail source method, the above-mentioned other precursor is preferably a compound which is similar to the compound represented by the general formula (1) in the behavior of thermal decomposition and/or oxidative decomposition, and also does not cause alternation through a chemical reaction or the like at the time of mixing.

In addition, the thin-film forming raw material, which is used in an atomic layer deposition method, of the present invention may contain a nucleophilic reagent as required in order to improve the stability of the compound represented by the general formula (1) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents falls within preferably a range of from 0.1 mol to 10 mol, more preferably a range of from 1 mol to 4 mol with respect to 1 mol of the amount of the entire precursors.

The thin-film forming raw material, which is used in an atomic layer deposition method, of the present invention is prevented from containing impurity metal elements other than the components forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less. The total content of the impurity organic substances is preferably 500 ppm or less, more preferably 50 ppm or less, most preferably 10 ppm or less. In addition, moisture causes generation of particles in the thin-film forming raw material, which is used in an atomic layer deposition method, and generation of particles during thin-film formation, and hence it is better to remove moisture in the precursor, the organic solvent, and the nucleophilic reagent as much as possible in advance at the time of use in order to reduce moisture in each of the precursor, the organic solvent, and the nucleophilic reagent. The moisture content of each of the precursor, the organic solvent, and the nucleophilic reagent is preferably 10 ppm or less, more preferably 1 ppm or less.

In addition, it is preferred that the thin-film forming raw material, which is used in an atomic layer deposition method, of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 µm be 100 or less in 1 mL of the liquid phase, it is more preferred that the number of particles larger than 0.2 µm be 1,000 or less in 1 mL of the liquid phase, and it is most preferred that the number of particles larger than 0.2 µm be 100 or less in 1 mL of the liquid phase.

The thin-film forming raw material of the present invention contains the compound represented by the general formula (2).

In the general formula (2), $R^5$ to $R^8$ each independently represent an alkyl group having 1 to 5 carbon atoms, and $A^2$ represents an alkanediyl group having 1 to 5 carbon atoms, provided that a sum of the carbon atoms of $R^5$ to $R^8$ and $A^2$ is 8 or more.

In the general formula (2), examples of the alkyl group having 1 to 5 carbon atoms represented by $R^5$ to $R^8$ include methyl, ethyl, n-propyl, isopropyl, n-butyl, sec-butyl, tert-butyl, isobutyl, n-pentyl, sec-pentyl, tert-pentyl, isopentyl, and neopentyl.

In the general formula (2), examples of the alkanediyl group having 1 to 5 carbon atoms represented by $A^2$ include methylene, ethylene, propylene, methylethylene, butylene, 1-methylpropylene, 2-methylpropylene, 1,2-dimethylpropylene, 1,3-dimethylpropylene, 1-methylbutylene, 2-methylbutylene, 3-methylbutylene, and 4-methylbutylene.

In the general formula (2), $R^5$ to $R^8$ and $A^2$ are appropriately selected depending on the method of producing a thin-film to be applied, and the sum of the carbon atoms of $R^5$ to $R^8$ and $A^2$ is required to be 8 or more. When the sum of the carbon atoms of $R^5$ to $R^8$ and $A^2$ is less than 7, there is a problem in that the melting point becomes significantly high.

When the raw material is used in a method of producing a thin-film including the step of vaporizing a compound, it is preferred that $R^5$ to $R^8$ and $A^2$ be combined so that the compound has a liquid state at normal temperature and normal pressure and has a high vapor pressure. Specifically, the compound in which $R^5$ to $R^8$ each independently represent methyl or ethyl is preferred because the vapor pressure is high. Of those, the compound in which $R^5$=$R^6$ is particularly preferred. In addition, the sum of the carbon atoms of $R^5$ to $R^8$ and $A^2$ falls within preferably a range of from 8 to 10. Of those, the compound in which $A^2$ represents propylene or 2-methylpropylene is particularly preferred because the melting point is low, and the transportability is satisfactory.

As preferred specific examples of the compound represented by the general formula (2) to be used in the thin-film forming raw material of the present invention, there are given, for example, the above-mentioned compounds No. 5, No. 6, No. 9, No. 10, No. 11, No. 12, and No. 14 to No. 30.

Next, the thin-film forming raw material of the present invention is obtained through use of the compound represented by the general formula (2) as a precursor of a thin-film, and the form thereof varies depending on a production process to which the thin-film forming raw material is applied. For example, when a thin-film containing only gallium as a metal is produced, the thin-film forming raw material of the present invention does not contain a metal compound other than the compound represented by the general formula (2) and a semimetal compound. Meanwhile, when a thin-film containing two or more kinds of metals and/or semimetals is produced, the thin-film forming raw material of the present invention may also contain a compound containing a desired metal and/or a compound containing a semimetal (hereinafter sometimes referred to as "other precursor") in addition to the compound represented by the general formula (2). The thin-film forming raw material of the present invention may further contain an organic solvent and/or a nucleophilic reagent as described later. As described above, the physical properties of the compound represented by the general formula (2) serving as a precursor are suitable for a CVD method and an ALD method, and hence the thin-film forming raw material of the present invention is useful, in particular, as a chemical vapor deposition raw material (hereinafter sometimes referred to as "CVD raw material").

When the thin-film forming raw material of the present invention is a chemical vapor deposition raw material, the form thereof is appropriately selected depending on a procedure, such as a transportation and supply method of the CVD method to be used.

As the above-mentioned transportation and supply method, there are given a gas transportation method and a liquid transportation method. The gas transportation method involves heating and/or decompressing the CVD raw material in a container in which the raw material is stored (hereinafter sometimes simply referred to as "raw material container"), to thereby vaporize the raw material to obtain vapor, and introducing the vapor into a film formation chamber (hereinafter sometimes referred to as "deposition reaction portion") having a substrate set therein together with a carrier gas, such as argon, nitrogen, or helium, to be used as required. The liquid transportation method involves transporting the CVD raw material to a vaporization chamber under a state of a liquid or a solution, heating and/or decompressing the raw material in the vaporization chamber, to thereby vaporize the raw material to obtain vapor, and introducing the vapor into the film formation chamber. In the case of the gas transportation method, the compound represented by the general formula (2) itself may be used as the CVD raw material. In the case of the liquid transportation method, the compound represented by the general formula (2) itself or a solution obtained by dissolving the compound in an organic solvent may be used as the CVD raw material. Those CVD raw materials may further contain the other precursor, a nucleophilic reagent, and the like.

In addition, in a multi-component CVD method, there are given a method involving vaporizing and supplying the CVD raw material independently for each component (hereinafter sometimes referred to as "single source method"), and a method involving vaporizing and supplying a mixed raw material obtained by mixing a multi-component raw material with a desired composition in advance (hereinafter sometimes referred to as "cocktail source method"). In the case of the cocktail source method, a mixture of the compound represented by the general formula (2) and the other precursor or a mixed solution obtained by dissolving the mixture in an organic solvent may be used as the CVD raw material. The mixture or the mixed solution may further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents are used alone or as a mixed solvent thereof depending on the solubility of a solute, the relationship among the use temperature, the boiling point, and the flash point, and the like. When those organic solvents are used, it is preferred that the amount of the entire precursors in the CVD raw material which is a solution obtained by dissolving the precursors in the organic solvent be from 0.01 mol/liter to 2.0 mol/liter, particularly from 0.05 mol/liter to 1.0 mol/liter. When the thin-film forming raw material of the present invention is free of a metal compound other than the compound represented by the general formula (2) and a semimetal compound, the amount of the entire precursors refers to the amount of the compound represented by the general formula (2). When the thin-film forming raw material of the present invention contains a compound containing another metal and/or a compound containing a semimetal in addition to the compound represented by the general formula (2), the amount of the entire precursors refers to the total amount of the ruthenium compound of the present invention and the other precursor.

In addition, in the case of the multi-component CVD method, there is no particular limitation on the other precursor to be used together with the compound represented by the general formula (2), and well-known general precursors used in the CVD raw material may be used.

Examples of the other precursor include compounds of one kind or two or more kinds selected from the group consisting of compounds used as organic ligands, such as an alcohol compound, a glycol compound, a β-diketone compound, a cyclopentadiene compound, and an organic amine compound, and silicon or a metal. In addition, examples of the kind of the metal in the precursor include lithium, sodium, potassium, magnesium, calcium, strontium, barium, titanium, zirconium, hafnium, vanadium, niobium, tantalum, chromium, molybdenum, tungsten, manganese, iron, ruthenium, cobalt, rhodium, iridium, nickel, palladium, platinum, copper, silver, gold, zinc, aluminum, indium, germanium, tin, lead, antimony, bismuth, scandium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

In addition, examples of the β-diketone compound include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

In addition, examples of the cyclopentadiene compound include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene, and examples of the organic amine compound to be used as the above-mentioned organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. One example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

In the case of the single source method, the above-mentioned other precursor is preferably a compound which is similar to the compound represented by the general formula (2) in the behavior of thermal decomposition and/or oxidative decomposition. In the case of the cocktail source method, the above-mentioned other precursor is preferably a compound which is similar to the compound represented by the general formula (2) in the behavior of thermal decomposition and/or oxidative decomposition, and also does not cause alternation through a chemical reaction or the like at the time of mixing.

In addition, the thin-film forming raw material of the present invention may contain a nucleophilic reagent as required in order to impart stability to the ruthenium compound of the present invention and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents falls within preferably a range of from 0.1 mol to 10 mol, more preferably a range of from 1 mol to 4 mol with respect to 1 mol of the amount of the entire precursors.

The thin-film forming raw material of the present invention is prevented from containing impurity metal elements other than the components forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less. The total content of the impurity organic substances is preferably 500 ppm or less, more preferably 50 ppm or less, most preferably 10 ppm or less. In addition, moisture causes generation of particles in the chemical vapor deposition raw material and generation of particles during thin-film formation, and hence it is better to remove moisture in the precursor, the organic solvent, and the nucleophilic reagent as much as possible in advance at the time of use in order to reduce moisture in each of the precursor, the organic solvent, and the nucleophilic reagent. The moisture content of each of the precursor, the organic solvent, and the nucleophilic reagent is preferably 10 ppm or less, more preferably 1 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is most preferred that the number of particles larger than 0.2 μm be 100 or less in 1 mL of the liquid phase.

A method of producing a thin-film of the present invention is a method of producing a thin-film by the ALD method using, as a raw material, the thin-film forming raw material, which is used in an atomic layer deposition method, of the present invention, and a method of producing a thin-film by the CVD method using the thin-film forming raw material of the present invention.

In the method of producing a thin-film of the present invention, the method of producing a thin-film by the ALD method using, as a raw material, the thin-film forming raw material, which is used in an atomic layer deposition method, of the present invention is a method of producing a thin-film containing a gallium atom on a surface of a substrate by the ALD method, and is characterized by including the steps of: vaporizing the thin-film forming raw material, which is used in an atomic layer deposition method, to deposit the raw material on the surface of the substrate, to thereby form a precursor thin-film; and causing the precursor thin-film to react with a reactive gas, to thereby form a thin-film containing a gallium atom on the surface of the substrate.

As a material for the substrate, there are given, for example: silicon; ceramics, such as silicon nitride, titanium nitride, tantalum nitride, titanium oxide, titanium nitride, ruthenium oxide, zirconium oxide, hafnium oxide, and lanthanum oxide; glass; and metals, such as metal cobalt. The shape of the substrate is, for example, a plate shape, a spherical shape, a fibrous shape, or a scaly shape. The surface of the substrate may be planar, or may have a three-dimensional structure, such as a trench structure.

In addition, as a method of introducing vapor obtained by vaporizing the thin-film forming raw material, which is used in an atomic layer deposition method, into the film formation chamber in which the substrate is installed, there are given the above-mentioned gas transportation method, liquid transportation method, single source method, cocktail source method, and the like.

Examples of the reactive gas include: oxidizing gases, including oxygen, ozone, nitrogen dioxide, nitrogen monoxide, water vapor, hydrogen peroxide, formic acid, acetic acid, and acetic anhydride; reducing gases, including hydrogen; and nitriding gases, including organic amine compounds, such as a monoalkylamine, a dialkylamine, a trialkylamine, and an alkylenediamine, hydrazine, and ammonia. Those reactive gases may be used alone or as a mixture thereof. The thin-film forming raw material, which is used in an atomic layer deposition method, of the present invention has properties of reacting with, of those, oxidizing gases at specifically low temperature, in particular, satisfactorily reacting with water vapor. From the viewpoint that a high-quality thin-film containing less residual carbon therein can be produced with high productivity, a gas containing water vapor is preferably used as the reactive gas.

As conditions for the above-mentioned production, there are further given a temperature and a pressure when the thin-film forming raw material, which is used in an atomic layer deposition method, is vaporized to obtain vapor. The step of vaporizing the thin-film forming raw material, which is used in an atomic layer deposition method to obtain vapor may be performed in the raw material container or in the vaporization chamber. In any case, it is preferred that the thin-film forming raw material, which is used in an atomic layer deposition method, of the present invention be evaporated at a temperature of from 0° C. to 200° C. In addition, when the thin-film forming raw material, which is used in an atomic layer deposition method, is vaporized to obtain vapor in the raw material container or in the vaporization chamber, the pressure in the raw material container and the pressure in the vaporization chamber are both preferably from 1 Pa to 10,000 Pa.

There is no particular limitation on the production conditions in the method of producing a thin-film of the present invention. For example, the reaction temperature (substrate temperature), the reaction pressure, the deposition rate, and the like may be appropriately determined in accordance with the desired thickness and kind of a thin-film. The reaction temperature is preferably 100° C. or more, which is the temperature at which the thin-film forming raw material, which is used in an atomic layer deposition method, of the present invention sufficiently reacts, more preferably from 150° C. to 400° C., and the thin-film forming raw material, which is used in an atomic layer deposition method, of the present invention is used within the ALD window matched to the reactive gas. The film thickness is controlled by the number of cycles so as to obtain a desired film thickness.

Now, regarding each step of the ALD method, the case of forming a gallium oxide thin-film is described in detail as an example. First, vapor of a thin-film forming raw material, which is used in an atomic layer deposition method, is introduced into a film formation chamber (raw material introduction step). The preferred temperature and pressure when the thin-film forming raw material, which is used in an atomic layer deposition method, is turned into vapor fall within a range of from 0° C. to 200° C. and a range of from 1 Pa to 10,000 Pa, respectively. Next, the vapor introduced into the film formation chamber is deposited on the surface of a substrate, to thereby form a precursor thin-film on the surface of the substrate (precursor thin-film formation step). In this case, heat may be applied by heating the substrate or heating the film formation chamber. The temperature of the substrate when this step is performed is preferably from room temperature to 500° C., more preferably from 150° C. to 400° C. The ALD window when the thin-film forming raw material, which is used in an atomic layer deposition method, of the present invention, and an oxidizing gas are used in combination falls within a range of from about 200° C. to about 400° C. The pressure of a system (in the film formation chamber) when this step is performed is preferably from 1 Pa to 10,000 Pa, more preferably from 10 Pa to 1,000 Pa.

Next, vapor of the thin-film forming raw material, which is used in an atomic layer deposition method, remaining unreacted, and a gas generated as a by-product are evacuated from the film formation chamber (evacuation step). It is ideal that the vapor of the thin-film forming raw material, which is used in an atomic layer deposition method, remaining unreacted, and the gas generated as a by-product be completely evacuated from the film formation chamber, but it is not always required that the vapor and the by-product gas be completely evacuated. As an evacuation method, there are given, for example, a method involving purging the inside of the system with an inert gas, such as nitrogen, helium, and argon, a method involving performing evacuation by decompressing the inside of the system, and a combination of these methods. The decompression degree when decompression is performed is preferably from 0.01 Pa to 300 Pa, more preferably from 0.01 Pa to 100 Pa.

Next, an oxidizing gas is introduced as a reactive gas into the film formation chamber, and a gallium oxide thin-film is formed from the precursor thin-film formed in the previous precursor thin-film formation step through the action of the oxidizing gas or the action of the oxidizing gas and heat (gallium oxide thin-film formation step). In this step, the temperature when the heat is applied is preferably from room temperature to 500° C., more preferably from 150° C. to 400° C. The ALD window when the thin-film forming raw material, which is used in an atomic layer deposition method, of the present invention and the oxidizing gas are used in combination falls within a range of from about 200° C. to about 400° C., and hence it is most preferred that the precursor thin-film be subjected to a reaction with the oxidizing gas at a temperature within a range of from 200° C. to 400° C. The pressure of the system (in the film formation chamber) when this step is performed is preferably from 1 Pa to 10,000 Pa, more preferably from 10 Pa to 1,000 Pa. The thin-film forming raw material, which is used in an atomic layer deposition method, of the present invention has satisfactory reactivity with the oxidizing gas, such as water vapor, and thus a high-quality gallium oxide-containing thin-film containing less residual carbon can be produced with high productivity.

In the method of producing a thin-film of the present invention, thin-film deposition performed by a series of operations including the above-mentioned raw material introduction step, precursor thin-film formation step, evacuation step, and metal oxide-containing thin-film formation step is defined as one cycle, and this cycle may be repeated a plurality of times until a thin-film having a required film thickness is obtained. In this case, it is preferred that, after one cycle is performed, an unreacted reactive gas (oxidizing gas when a gallium oxide-containing thin-film is formed) and a gas generated as a by-product be evacuated from the film formation chamber in the same manner as in the above-mentioned evacuation step, and the subsequent one cycle be performed.

In addition, in the method of producing a thin-film of the present invention, energy, such as plasma, light, or a voltage, may be applied, and a catalyst may be used. There is no particular limitation on the timing for applying the energy and the timing for using the catalyst. The energy may be applied or the catalyst may be used, for example, at the time of introducing the vapor of the thin-film forming raw material, which is used in an atomic layer deposition method in the raw material introduction step, at the time of heating in the precursor thin-film formation step or the gallium oxide-containing thin-film formation step, at the time of evacuating the inside of the system in the evacuation step, or at the time of introducing the oxidizing gas in the gallium oxide-containing thin-film formation step, or between the above-mentioned respective steps.

In addition, in the method of producing a thin-film of the present invention, after the thin-film formation, annealing treatment may be performed in an inert atmosphere, an oxidizing atmosphere, or a reducing atmosphere in order to obtain more satisfactory electrical characteristics. When step embedding is required, a reflow step may be provided. The temperature in this case is from 200° C. to 1,000° C., preferably from 250° C. to 500° C.

Figure 2:
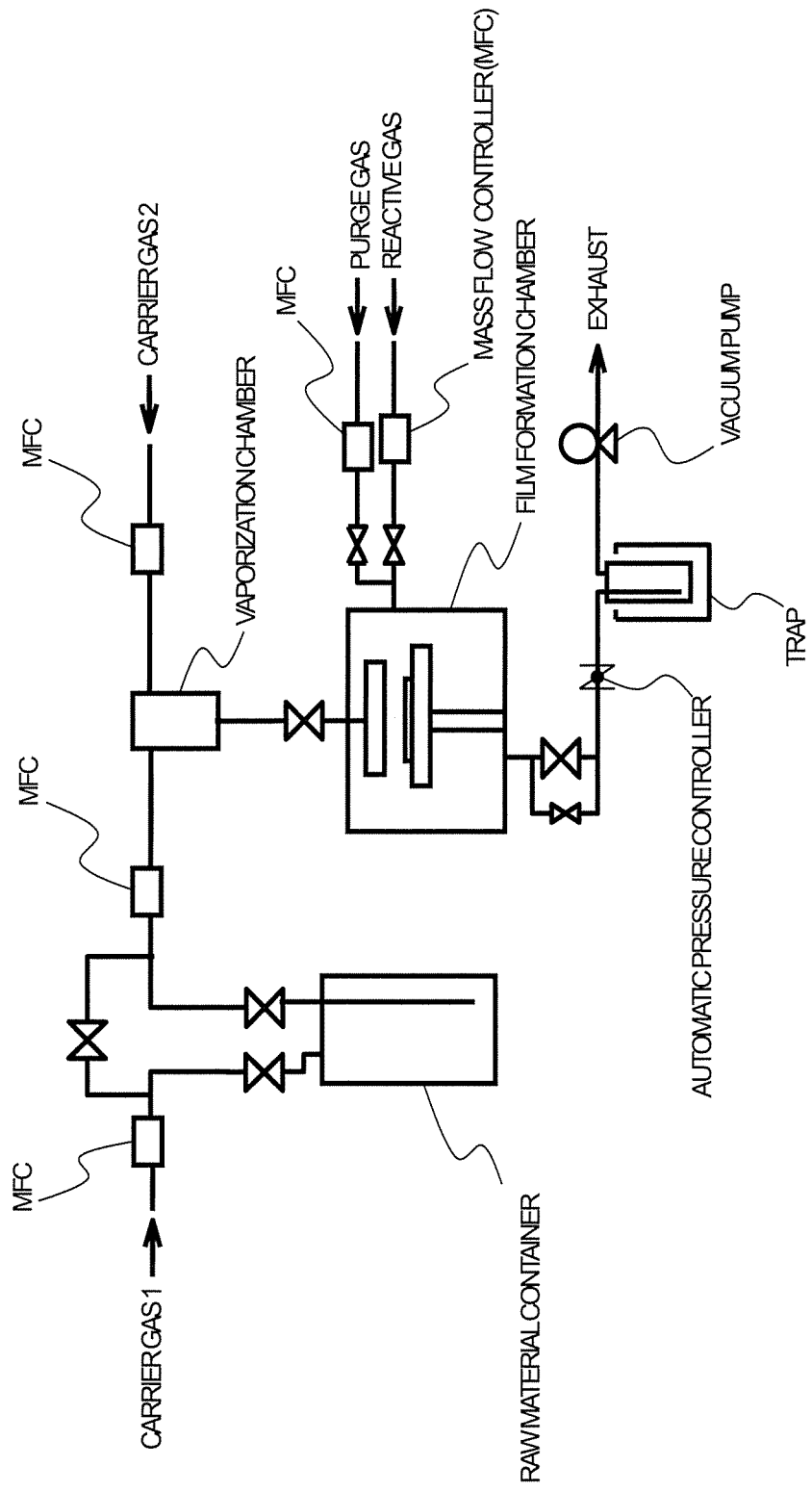
FIG. 2 is a schematic diagram for illustrating another example of the apparatus for chemical vapor deposition to be used in the method of producing a thin-film according to the present invention.
Figure 3:
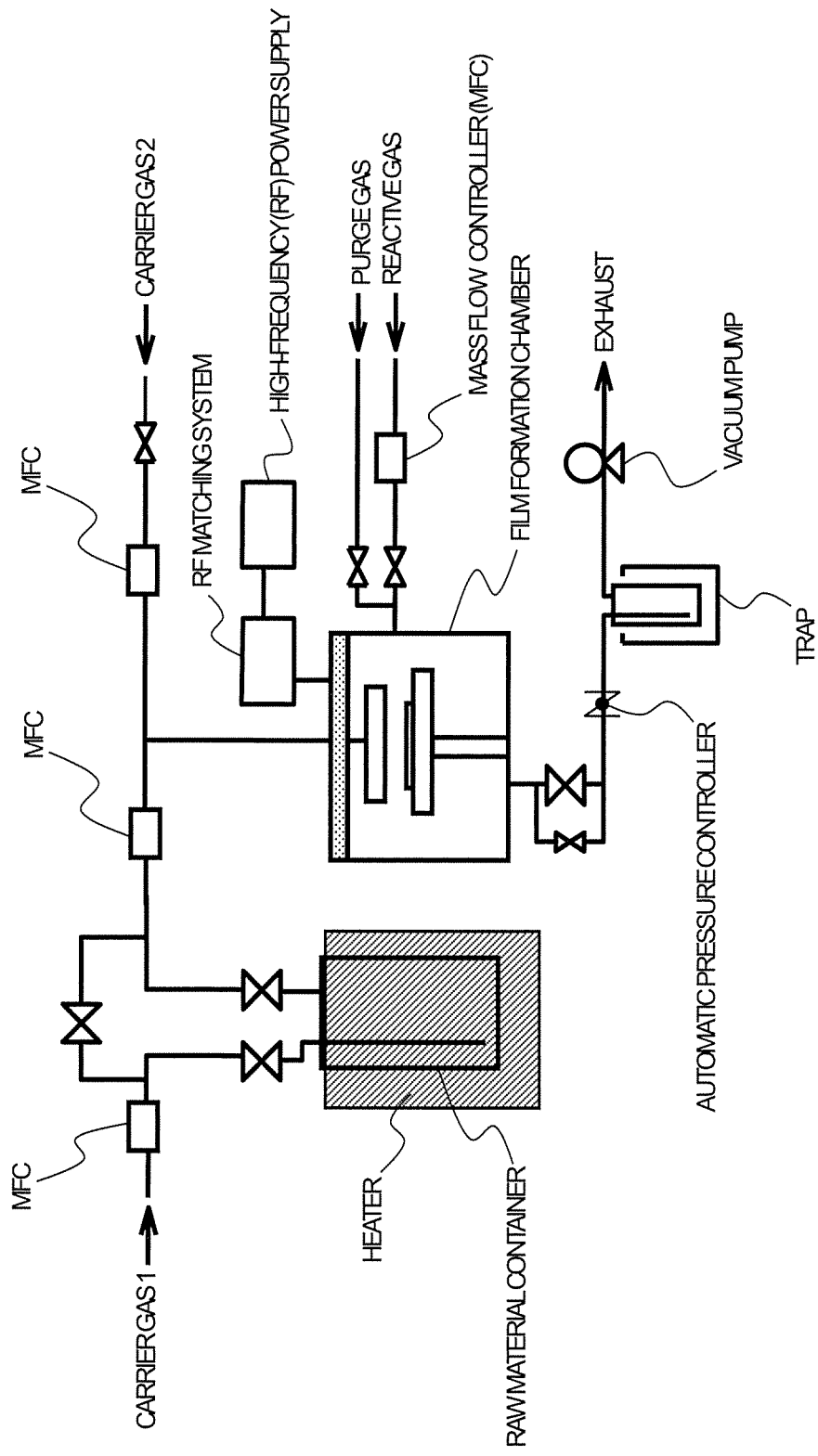
FIG. 3 is a schematic diagram for illustrating still another example of the apparatus for chemical vapor deposition to be used in the method of producing a thin-film according to the present invention.
Figure 4:
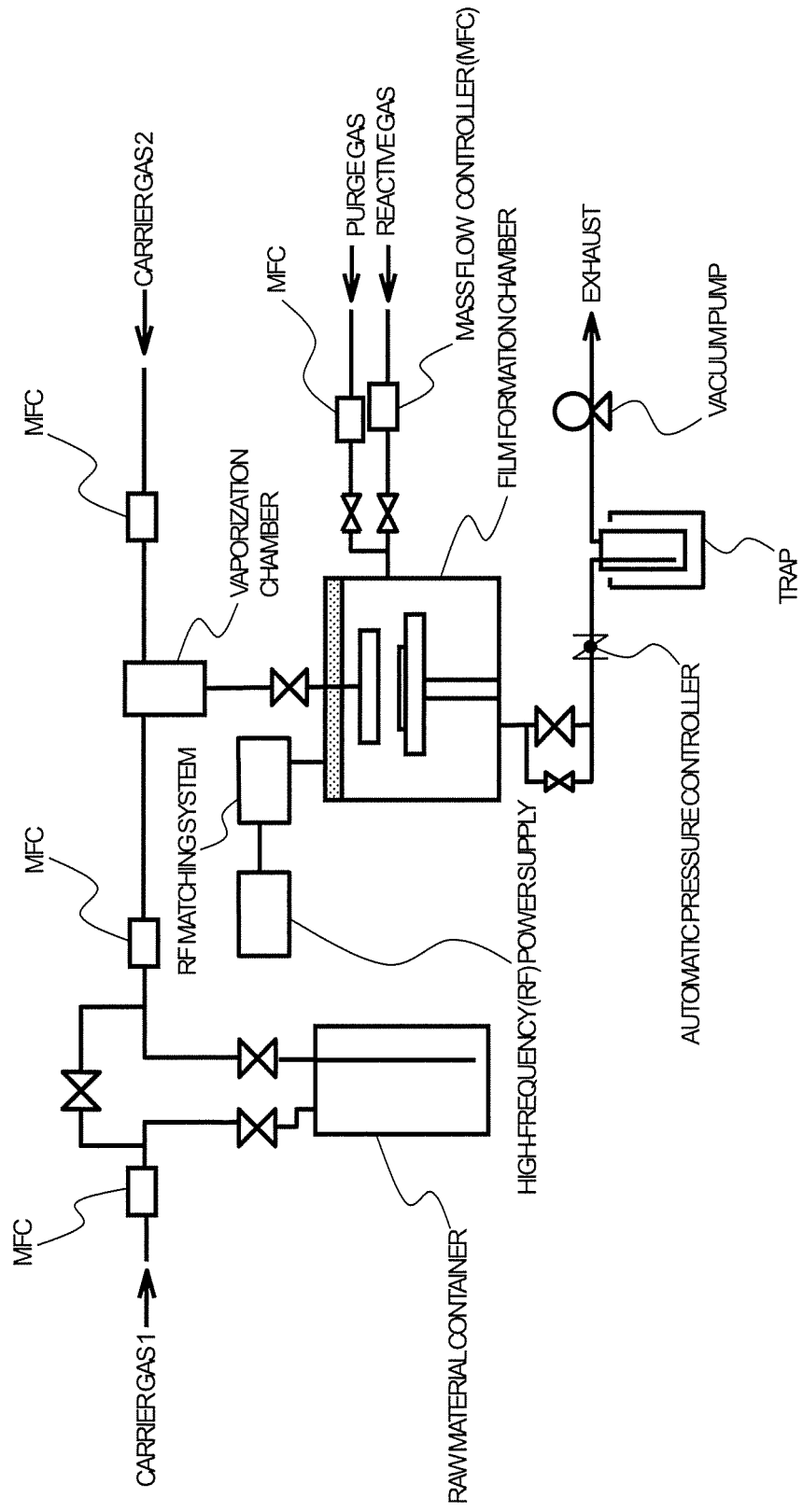
FIG. 4 is a schematic diagram for illustrating yet still another example of the apparatus for chemical vapor deposition to be used in the method of producing a thin-film according to the present invention.

As an apparatus for producing a thin-film through use of the thin-film forming raw material, which is used in an atomic layer deposition method, of the present invention, a well-known apparatus for an atomic layer deposition method may be used. As specific examples of the apparatus, there are given an apparatus capable of performing bubbling supply of a precursor as illustrated in FIG. 1 and an apparatus including a vaporization chamber as illustrated in FIG. 2. In addition, there is given an apparatus capable of subjecting the reactive gas to plasma treatment as illustrated in FIG. 3 and FIG. 4. The apparatus is not limited to single-substrate type apparatus as illustrated in FIG. 1 to FIG. 4, and an apparatus capable of simultaneously processing a large number of substrates through use of a batch furnace may also be used.

The method of producing a thin-film of the present invention is a method of producing a thin-film by the ALD method using, as a raw material, the thin-film forming raw material, which is used in an atomic layer deposition method, of the present invention, and a method of producing a thin-film by the CVD method using the thin-film forming raw material of the present invention.

In the method of producing a thin-film of the present invention, the method of producing a thin-film by the CVD method using, as a raw material, the thin-film forming raw material of the present invention is a method of producing a thin-film containing a gallium atom on a surface of a substrate by the CVD method, and the CVD method involves introducing vapor obtained by vaporizing the thin-film forming raw material of the present invention and a reactive gas to be used as required into a film formation chamber (treatment atmosphere) having a substrate set therein, and then subjecting a precursor to decomposition and/or a chemical reaction on the substrate, to thereby grow and deposit the thin-film containing a metal on the surface of the substrate. There is no particular limitation on the raw material transportation and supply method, deposition method, conditions for production, production apparatus, and the like, and well-known general conditions and methods may be used.

Examples of the above-mentioned reactive gas to be used as required include: oxidizing reactive gases, such as oxygen, ozone, nitrogen dioxide, nitrogen monoxide, water vapor, hydrogen peroxide, formic acid, acetic acid, and acetic anhydride; and reducing reactive gases, such as hydrogen. In addition, examples of the reactive gas to produce a nitride include organic amine compounds, such as a monoalkylamine, a dialkylamine, a trialkylamine, and an alkylenediamine, hydrazine, and ammonia. Those reactive gases may be used alone or in combination thereof. Of those, ozone has satisfactory reactivity with the thin-film forming raw material of the present invention. Accordingly, ozone is preferably used when one kind is used as the reactive gas, and at least ozone is preferably contained when a mixed gas of two or more kinds is used as the reactive gas.

In addition, as the above-mentioned transportation and supply method, there are given the above-mentioned gas transportation method, liquid transportation method, single source method, cocktail source method, and the like.

In addition, as the above-mentioned deposition method, there are given thermal CVD involving causing a raw material gas or a raw material gas and a reactive gas to react only with heat, to thereby deposit a thin-film, plasma CVD using heat and plasma, optical CVD using heat and light, optical plasma CVD using heat, light, and plasma, and ALD involving dividing a deposition reaction of CVD into elementary steps, and performing deposition at a molecular level in a stepwise manner, and production of a thin-film by the ALD is as described above.

As a material for the substrate, there are given, for example: silicon; ceramics, such as silicon nitride, titanium nitride, tantalum nitride, titanium oxide, titanium nitride, ruthenium oxide, zirconium oxide, hafnium oxide, and lanthanum oxide; glass; and metals, such as metal cobalt. The shape of the substrate is, for example, a plate shape, a spherical shape, a fibrous shape, or a scaly shape. The surface of the substrate may be planar, or may have a three-dimensional structure, such as a trench structure.

In addition, as conditions for the above-mentioned production, there are given a reaction temperature (substrate temperature), a reaction pressure, a deposition rate, and the like. The reaction temperature is preferably 100° C. or more, which is the temperature at which the compound of the present invention sufficiently reacts, more preferably from 150° C. to 400° C., particularly preferably from 200° C. to 350° C. In addition, the reaction pressure is preferably from 10 Pa to an atmospheric pressure in the case of the thermal CVD or the optical CVD, and is preferably from 10 Pa to 2,000 Pa in the case of using plasma.

In addition, the deposition rate may be controlled by the supply conditions (vaporization temperature, vaporization pressure) of a raw material, the reaction temperature, and the reaction pressure. When the deposition rate is high, the characteristics of a thin-film to be obtained may be deteriorated. When the deposition rate is low, a problem may occur in productivity. Accordingly, the deposition rate is preferably from 0.01 nm/min to 100 nm/min, more preferably from 1 nm/min to 50 nm/min.

As conditions for the above-mentioned production, there are further given a temperature and a pressure when the thin-film forming raw material is vaporized to obtain vapor. The step of vaporizing the thin-film forming raw material to obtain vapor may be performed in the raw material container or in the vaporization chamber. In any case, it is preferred that the thin-film forming raw material of the present invention be evaporated at a temperature of from 0° C. to 150° C.

In addition, when the thin-film forming raw material is vaporized to obtain vapor in the raw material container or in the vaporization chamber, the pressure in the raw material container and the pressure in the vaporization chamber are both preferably from 1 Pa to 10,000 Pa.

A thin-film produced through use of the thin-film forming raw material of the present invention may be formed as desired kinds of thin-films, such as thin-films of a metal, oxide ceramics, nitride ceramics, and glass, by appropriately selecting the other precursor, the reactive gas, and the production conditions. It has been known that the thin-films exhibit electrical characteristics, optical characteristics, and the like, and the thin-films are used for various applications. There are given, for example, a metal gallium thin-film, a gallium oxide thin-film, a gallium-containing composite oxide thin-film, a gallium nitride thin-film, a gallium alloy thin-film, and the like. As the gallium alloy, there is given, for example, an iron gallium alloy. In addition, as the gallium-containing composite oxide, there is given Tb$_3$Ga$_5$O$_{12}$. Those thin-films have been widely used, for example, in the production of thin-films for electronic devices such as semiconductors and films for optoelectronic applications such as solar cells or LEDs.

The compound of the present invention is a compound represented by the general formula (3), and has a low melting point and is applicable to the ALD method. Accordingly, the compound of the present invention can be suitably used as an ALD method raw material.

In the general formula (3), R$^9$ to R$^{12}$ each independently represent an alkyl group having 1 to 5 carbon atoms.

In the general formula (3), examples of the alkyl group having 1 to 5 carbon atoms represented by R$^9$ to R$^{12}$ include methyl, ethyl, n-propyl, isopropyl, n-butyl, sec-butyl, tert-butyl, isobutyl, n-pentyl, sec-pentyl, tert-pentyl, isopentyl, and neopentyl.

In the general formula (3), R$^9$ to R$^{12}$ are appropriately selected depending on the method of producing a thin-film to be applied. The compound in which R$^9$ to R$^{12}$ each independently represent methyl or ethyl is preferred because the melting point is low, the ALD window is wide, a residual carbon component in a gallium oxide thin-film produced by the ALD method using water vapor as a reactive gas is specifically low, and a significantly high-quality thin-film can be produced. Of those, the compound in which R$^9$ to R$^{12}$ all represent methyl is particularly preferred.

As preferred specific examples of the compound represented by the general formula (3) of the present invention, there are given, for example, the above-mentioned compounds No. 25 to No. 30.

With regard to a production method for the compound represented by the general formula (3) of the present invention, the compound is not particularly limited by the production method therefor, and may be produced by a well-known synthesis method. For example, the compound may be obtained by subjecting gallium chloride and a halogenated dialkylamine to a Grignard reaction and causing the resultant to react with an alkyllithium.

EXAMPLES

Now, the present invention is described in more detail by way of Examples, production examples, Comparative Examples, and evaluation examples. However, the present invention is not limited by the following Examples and the like.

[Example 1] Synthesis of Compound No. 25

102 g of 3-dimethylamino-2-methylpropyl chloride hydrochloride, 216 g of ultrapure water, and 78.7 g of dehydrated pentane were added to a reaction flask, followed by mixing. 107 g of a 25% sodium hydroxide aqueous solution was added dropwise to the obtained solution at room temperature, and the mixture was stirred for 1 hour. The obtained reaction solution was separated into an organic phase and an aqueous phase through use of a separating funnel, and then extraction from the aqueous phase was performed three times through use of each 50 mL of dehydrated pentane. The obtained organic phases were combined, and magnesium sulfate was added thereto. The mixture was stirred at room temperature for 30 minutes, and dehydrated and dried. After filtration and separation of magnesium sulfate, the filtrate was subjected to solvent removal in an oil bath at 60° C. The obtained ligand was distilled under reduced pressure in an oil bath at 60° C. to obtain 70.8 g of 3-dimethylamino-2-methylpropyl chloride as a colorless transparent liquid.

1.65 g of ribbon-shaped magnesium was added to a reaction flask, and the reaction flask was placed under an argon atmosphere. Then, 43.1 g of dehydrated THF and 1.16 g of dibromoethane were added to the resultant, and the mixture was stirred in an oil bath at 60° C. 11.7 g of 3-dimethylamino-2-methylpropyl chloride was added dropwise to the mixed solution under heating, and the mixture was heated and refluxed for 5 hours to prepare a Grignard reagent. 10.6 g of gallium chloride and 50.8 g of dehydrated toluene were added to a separately prepared reaction flask, and the mixture was stirred under ice cooling until the temperature of the mixed solution reached 10° C. or less. The Grignard reagent described above was added dropwise to the reaction solution under ice cooling, and after completion of the dropwise addition, the mixture was returned to room temperature and stirred for 18 hours. After the obtained reaction solution was filtered, solvent removal was performed in an oil bath at 100° C. The flask containing the generated gallium complex was connected to a distillation device, and the gallium complex was purified through distillation in an oil bath at 150° C. and 12 Pa to obtain 6.22 g of N,N-dimethylamino-2-methylpropylgallium dichloride as a white solid.

3.77 g of N,N-dimethylamino-2-methylpropylgallium dichloride obtained above and 11.6 g of dehydrated pentane were added to a reaction flask under an Ar atmosphere, and the mixture was stirred under ice cooling until the temperature reached 10° C. or less. 26.1 g of methyllithium (1.16 M diethyl ether solution) was added dropwise to the mixed solution under ice cooling, and after the completion of the dropwise addition, the mixture was returned to room temperature and stirred for 24 hours. The obtained reaction solution was filtered, and solvent removal was performed in an oil bath at 60° C. The flask containing the generated gallium complex was connected to a distillation purification device, and the gallium complex was purified through distillation in an oil bath at 60° C. and 130 Pa to obtain 1.07 g of a colorless transparent liquid.

(Analytic Values)
(1) Normal-Pressure TG-DTA
  50% mass loss temperature: 119° C. (760 Torr, Ar flow rate: 100 ml/min, temperature increase rate: 10° C./min)
(2) 1H-NMR (Deuterated Benzene)
  −0.16 ppm (6H, singlet), 0.53 ppm (1H, d=7.98, triplet), 0.84 ppm (1H, d=4.80, 12.6, dubletdublet), 0.93 ppm (3H, d=6.00, dublet), 1.62-1.69 ppm (1H, multiplet), 1.65 ppm (2H, singlet), 1.67 ppm (3H, singlet), 1.75 ppm (3H, singlet)
(3) Elemental Analysis (Theoretical Values)
  C: 48.2% (48.05%), H: 9.8% (10.08%), Ga: 34.8% (34.87%), N: 7.1% (7.00%)

[Production Example 1] Synthesis of Compound No. 13

59.7 g of 3-dimethylaminopropyl chloride hydrochloride, 133 g of ultrapure water, and 59.3 g of dehydrated pentane were added to a reaction flask, followed by mixing. 130 g of a 22% sodium hydroxide aqueous solution was added dropwise to the obtained solution at room temperature, and the mixture was stirred for 1.5 hours. The obtained reaction solution was separated into an organic phase and an aqueous phase through use of a separating funnel, and then extraction from the aqueous phase was performed three times through use of each 50 mL of dehydrated pentane. The obtained organic phases were combined, and magnesium sulfate was added thereto. The mixture was stirred at room temperature for 30 minutes, and dehydrated and dried. After filtration and separation of magnesium sulfate, the filtrate was subjected to solvent removal in an oil bath at 50° C. The obtained ligand was distilled under reduced pressure in an oil bath at 65° C. to obtain 40.2 g of 3-dimethylaminopropyl chloride as a colorless transparent liquid.

6.62 g of ribbon-shaped magnesium was added to a reaction flask, and the reaction flask was placed under an argon atmosphere. Then, 55.7 g of dehydrated THF and 4.86 g of dibromoethane were added to the resultant, and the mixture was stirred in an oil bath at 80° C. 27.2 g of 3-dimethylaminopropyl chloride was added dropwise to the mixed solution under heating, and the mixture was heated and refluxed for 14 hours to prepare a Grignard reagent. 38.9 g of gallium chloride and 235 g of dehydrated toluene were added to a separately prepared reaction flask, and the mixture was stirred under ice cooling until the temperature of the mixed solution reached 10° C. or less. The Grignard reagent described above was added dropwise to the reaction solution under ice cooling, and after completion of the dropwise addition, the mixture was returned to room temperature and stirred for 21 hours. After the obtained reaction solution was filtered, solvent removal was performed in an oil bath at 100° C. The flask containing the generated gallium complex was connected to a distillation device, and the gallium complex was purified through distillation in an oil bath at 130° C. and 9 Pa to obtain 40.8 g of N,N-dimethylaminopropylgallium dichloride as a white solid.

4.14 g of N,N-dimethylaminopropylgallium dichloride obtained above and 14.8 g of dehydrated hexane were added to a reaction flask under an Ar atmosphere, and the mixture was stirred under ice cooling until the temperature reached 10° C. or less. 31.2 g of methyllithium (1.16 M diethyl ether solution) was added dropwise to the mixed solution under ice cooling, and after the completion of the dropwise addition, the mixture was returned to room temperature and stirred for 22 hours. The obtained reaction solution was filtered, and solvent removal was performed in an oil bath at 80° C. The flask containing the generated gallium complex was connected to a distillation purification device, and the gallium complex was purified through distillation in an oil bath at 85° C. under slightly reduced pressure to obtain 1.87 g of a white solid.

(Analytic Values)
(1) Normal-Pressure TG-DTA
50% mass loss temperature: 116° C. (760 Torr, Ar flow rate: 100 ml/min, temperature increase rate: 10° C./min)
(2) 1H-NMR (Deuterated Benzene)
−0.18 ppm (6H, singlet), 0.54 ppm (2H, d=7.20, triplet), 1.56-1.63 ppm (2H, multiplet), 1.67 ppm (6H, singlet), 1.79 ppm (2H, d=5.60, triplet)
(3) Elemental Analysis (Theoretical Values)
C: 45.% (45.21%), H: 9.8% (9.76%), Ga: 37.3% (37.50%), N: 7.2% (7.53%)

[Production Example 2] Synthesis of Compound No. 16

5.31 g of N,N-dimethylaminopropylgallium dichloride obtained in Production Example 1 and 20.0 g of dehydrated hexane were added to a reaction flask under an Ar atmosphere, and the mixture was stirred under ice cooling until the temperature reached 10° C. or less. 46.62 g of ethylmagnesium chloride (1.05 M THF solution) was added dropwise to the mixed solution under ice cooling, and after the completion of the dropwise addition, the mixture was returned to room temperature and stirred for 20 hours. The obtained reaction solution was filtered, and solvent removal was performed in an oil bath at 90° C. The flask containing the generated gallium complex was connected to a distillation purification device, and the gallium complex was purified through distillation in an oil bath at 95° C. and 75 Pa to obtain 3.78 g of a colorless transparent liquid.

(Analytic Values)
(1) Normal-Pressure TG-DTA
50% mass loss temperature: 146° C. (760 Torr, Ar flow rate: 100 ml/min, temperature increase rate: 10° C./min)
(2) 1H-NMR (Deuterated Benzene)
0.37-0.56 ppm (6H, multiplet), 1.39 ppm (6H, d=8.40, triplet), 1.56-1.63 ppm (2H, multiplet), 1.73 ppm (6H, singlet), 1.80 ppm (2H, d=5.60, triplet)
(3) Elemental Analysis (Theoretical Values)
C: 50.2% (50.51%), H: 10.5% (10.36%), Ga: 32.1% (32.58%), N: 6.8% (6.55%)

[Evaluation Example 1] Evaluation of Physical Properties and Melting Point of Gallium Compound The state at 25° C. and normal pressure of each of Compounds No. 25, No. 13, and No. 16 obtained respectively in Example 1, Production Example 1, and Production Example 2, and the following Comparative Compound 1 (trimethylgallium) and Comparative Compound 2 (gallium (III) acetylacetonate) was visually observed. Those which were solids at 25° C. were measured for a melting point. The results thereof are shown in Table 1.

TABLE 1

|  | Compound | State at 25° C. | Melting point |
|---|---|---|---|
| Evaluation Example 1-1 | Compound No. 13 | Solid | 50° C. |
| Evaluation Example 1-2 | Compound No. 16 | Liquid | — |
| Evaluation Example 1-3 | Compound No. 25 | Liquid | — |
| Comparative Example 1 | Comparative Compound 1 | Liquid | — |
| Comparative Example 2 | Comparative Compound 2 | Solid | 200° C. |

It was found from the results in Table 1 that Compounds No. 16 and No. 25 and Comparative Compound 1 were liquids under the conditions of 25° C. and normal pressure. In addition, it was found that Compound No. 13 was a solid under the conditions of 25° C. and normal pressure, but became a liquid by slight heating. It was found that Comparative Compound 2 had a significantly high melting point.

[Example 2] Production of Gallium Oxide Thin-Film

A gallium oxide thin-film was produced on a silicon wafer by the ALD method under the following conditions through use of an apparatus illustrated in FIG. 1 with Compound No. 13 being used as a raw material, which is used in an atomic layer deposition method.

When the composition of the obtained thin-film was checked by X-ray photoelectron spectroscopy, the obtained thin-film was gallium oxide, and the residual carbon content was 6.2 atom %. In addition, when the film thickness was measured by an X-ray reflectivity method, and the average value thereof was calculated, the average film thickness was 26.4 nm, and the average film thickness obtained per cycle was 0.05 nm.

(Conditions)
Substrate: silicon wafer
Reaction temperature (silicon wafer temperature): 200° C.
Reactive gas: water vapor A series of steps including the following (1) to (4) was defined as one cycle, and this cycle was repeated 500 times.

(1) A raw material, which is used in an atomic layer deposition method, vaporized under the conditions of a raw material container temperature of 100° C. and a raw material container internal pressure of 100 Pa is introduced into a film formation chamber and deposited at a system pressure of 100 Pa for 0.1 second.

(2) The raw material which has not been deposited is removed through argon purging for 15 seconds.

(3) A reactive gas is introduced into the film formation chamber and subjected to a reaction at a system pressure of 100 Pa for 10 seconds.

(4) An unreacted first reactive gas and a by-product gas are removed through argon purging for 15 seconds.

[Example 3] Production of Gallium Oxide Thin-Film

A gallium oxide thin-film was produced under the same conditions as those in Example 2 except that Compound No. 16 was used as a raw material, which is used in an atomic layer deposition method. When the composition of the obtained thin-film was checked by X-ray photoelectron spectroscopy, the obtained thin-film was gallium oxide, and the residual carbon content was 3.0 atom %. In addition, when the film thickness was measured by an X-ray reflectivity method, and the average value thereof was calculated, the average film thickness was 25.7 nm, and the average film thickness obtained per cycle was 0.05 nm.

[Example 4] Production of Gallium Oxide Thin-Film

A gallium oxide thin-film was produced under the same conditions as those in Example 2 except that Compound No. 25 was used as a raw material, which is used in an atomic layer deposition method. When the composition of the obtained thin-film was checked by X-ray photoelectron spectroscopy, the obtained thin-film was gallium oxide, and the residual carbon content was less than 1.0 atom %. In addition, when the film thickness was measured by an X-ray reflectivity method, and the average value thereof was calculated, the average film thickness was 26.3 nm, and the average film thickness obtained per cycle was 0.05 nm.

[Example 5] Production of Gallium Oxide Thin-Film

A gallium oxide thin-film was produced under the same conditions as those in Example 4 except that ozone was used as a reactive gas. When the composition of the obtained thin-film was checked by X-ray photoelectron spectroscopy, the obtained thin-film was gallium oxide, and the residual carbon content was less than 1.0 atom %. In addition, when the film thickness was measured by an X-ray reflectivity method, and the average value thereof was calculated, the average film thickness was 27.3 nm, and the average film thickness obtained per cycle was 0.05 nm.

[Comparative Example 3] Production of Gallium Oxide Thin-Film

A gallium oxide thin-film was produced under the same conditions as those in Example 2 except that Comparative Compound 1 was used as a raw material, which is used in an atomic layer deposition method. When the composition of the obtained thin-film was checked by X-ray photoelectron spectroscopy, the obtained thin-film was gallium oxide, and the residual carbon content was 20.0 atom %. In addition, when the film thickness was measured by an X-ray reflectivity method, and the average value thereof was calculated, the average film thickness was 10 nm, and the average film thickness obtained per cycle was 0.02 nm.

It was found from the results in Examples 2 to 5 that, in each of the Examples, the residual carbon content was low, and a high-quality gallium oxide thin-film was able to be produced. Meanwhile, it was found that, in the thin-film obtained in Comparative Example 3, the residual carbon content was significantly high, and a low-quality gallium oxide thin-film was obtained. Of those, it was found that the gallium oxide thin-films obtained in Example 4 and Example 5 each had a specifically low residual carbon content, and were each a significantly high-quality gallium oxide thin-film. In addition, it was found from the results in Examples 2 to 5 that, as compared to Comparative Example 3, the film thickness obtained per cycle was large, and a high-quality thin-film was able to be obtained with significantly high productivity.

The invention claimed is:

1. A method of producing a thin-film containing a gallium atom on a surface of a substrate, the method comprising the step of introducing, into a treatment atmosphere, a vapor containing a compound obtained by vaporizing a thin-film forming raw material, which is used in an atomic layer deposition method, and subjecting the compound to decomposition and/or a chemical reaction, to thereby deposit the compound on the surface of the substrate, wherein the thin-film forming raw material, which is used in the atomic layer deposition method, comprises the following Compound No. 16 and/or Compound No. 25:

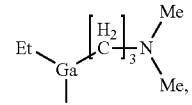

Compound No.16

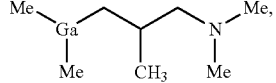

Compound No.25 and wherein a residual carbon content in the thin-film is 3.0 atom % or less.

* * * * *